United States Patent
Katscher et al.

(10) Patent No.: US 7,375,524 B2
(45) Date of Patent: May 20, 2008

(54) MR IMAGING WITH SENSITIVITY ENCODING IN THE READOUT DIRECTION

(75) Inventors: Ulrich Katscher, Norderstedt (DE); Mark J. Loncar, Mentor, OH (US); Michael R. Thompson, Cleveland Heights, OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 180 days.

(21) Appl. No.: 10/560,872

(22) PCT Filed: Jun. 1, 2004

(86) PCT No.: PCT/IB2004/001941

§ 371 (c)(1),
(2), (4) Date: Dec. 14, 2005

(87) PCT Pub. No.: WO2004/111672

PCT Pub. Date: Dec. 23, 2004

(65) Prior Publication Data
US 2007/0103156 A1 May 10, 2007

Related U.S. Application Data

(60) Provisional application No. 60/479,758, filed on Jun. 19, 2003.

(51) Int. Cl.
*G01V 3/00* (2006.01)
(52) U.S. Cl. ........................ 324/309; 324/307; 324/318
(58) Field of Classification Search ........ 324/306–309, 324/303, 318; 600/410
See application file for complete search history.

(56) References Cited

U.S. PATENT DOCUMENTS

| 6,166,545 A | 12/2000 | Polzin et al. ............... 324/309 |
| 6,242,916 B1 | 6/2001 | King ........................ 324/309 |
| 6,380,741 B1 | 4/2002 | Hajnal et al. ............... 324/318 |
| 6,396,269 B1 | 5/2002 | Hajnal et al. ............... 324/307 |

(Continued)

FOREIGN PATENT DOCUMENTS

EP   1 102 076 A2   5/2001

OTHER PUBLICATIONS

RD 445087 Multidimensional Sense with Non-Factorized Reduction Factor, May 2001; p. 796.

(Continued)

*Primary Examiner*—Brij Shrivastav
*Assistant Examiner*—Tiffany A Fetzner

(57) ABSTRACT

A magnetic resonance imaging system acquires a final image of a selected field of view with a selected spatial resolution. A magnetic resonance imaging scanner (10) encodes and receives magnetic resonance samples in phase encode and readout directions using a plurality of receive coils (14). The encoding and receiving undersamples in the readout direction. A reconstruction processor (30) reconstructs magnetic resonance samples acquired by each of the plurality of receive coils (14) into a corresponding plurality of intermediate reconstructed images. Each intermediate reconstructed image has aliasing and in some aspects degraded high spatial frequency characteristics due to the reduced sampling in the readout direction. A combining processor (40) combines the plurality of intermediate reconstructed images based on coil sensitivity factors (42) to produce the final reconstructed image with the selected field of view and the selected spatial resolution in the readout direction.

18 Claims, 11 Drawing Sheets

U.S. PATENT DOCUMENTS

Figure 1:
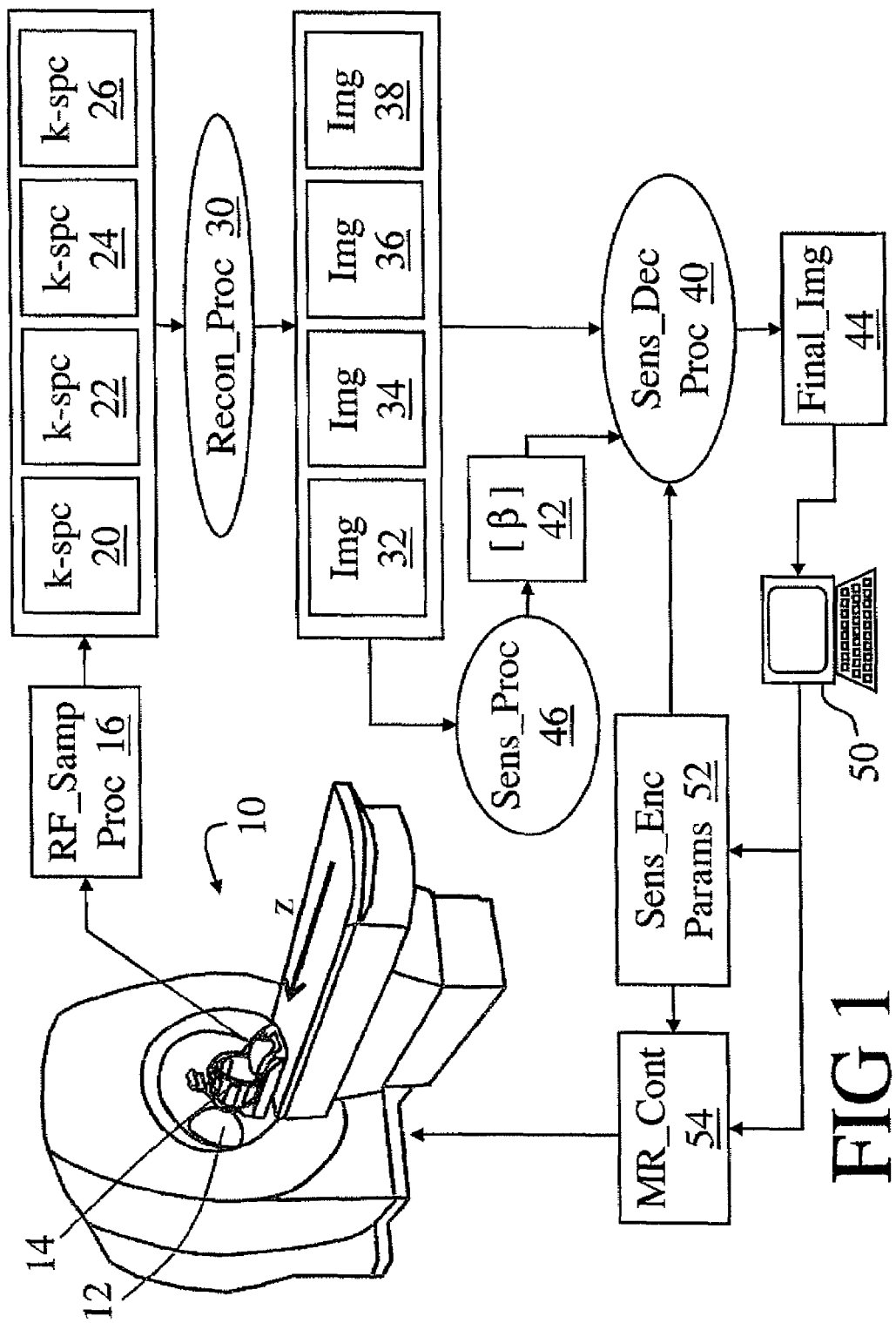

| | | | |
|---|---|---|---|
| 6,556,009 B2* | 4/2003 | Kellman et al. | 324/309 |
| 6,650,925 B2* | 11/2003 | Wang | 600/410 |
| 6,710,686 B2* | 3/2004 | Mertelmeier et al. | 324/314 |
| 6,771,067 B2* | 8/2004 | Kellman et al. | 324/307 |
| 6,950,543 B2* | 9/2005 | King et al. | 382/128 |
| 7,009,396 B2* | 3/2006 | Zhu et al. | 324/309 |
| 2002/0042568 A1 | 4/2002 | Fuderer et al. | 600/410 |
| 2002/0097050 A1* | 7/2002 | Kellman et al. | 324/309 |
| 2002/0111549 A1* | 8/2002 | Wang | 600/407 |
| 2002/0167315 A1* | 11/2002 | Kellman et al. | 324/307 |
| 2002/0173715 A1* | 11/2002 | Kruger et al. | 600/410 |
| 2002/0175683 A1* | 11/2002 | Martelmeier et al. | 324/314 |
| 2003/0030437 A1 | 2/2003 | Bydder et al. | 324/309 |
| 2003/0052676 A1 | 3/2003 | Takahashi et al. | 324/307 |
| 2003/0206648 A1* | 11/2003 | King et al. | 382/128 |
| 2004/0051529 A1* | 3/2004 | Zhu et al. | 324/318 |

OTHER PUBLICATIONS

Katcher, U., et al.; Theory and experimental verification of transmit Sense; 2002; Proc. Int'l. Soc. Mag. Reson. Med.; 10; p. 189.

Pruessmann, K.P., et al.; Sense: Sensitivity Encoding for Fast MRI; 1999: MRM; 42:952-962.

* cited by examiner

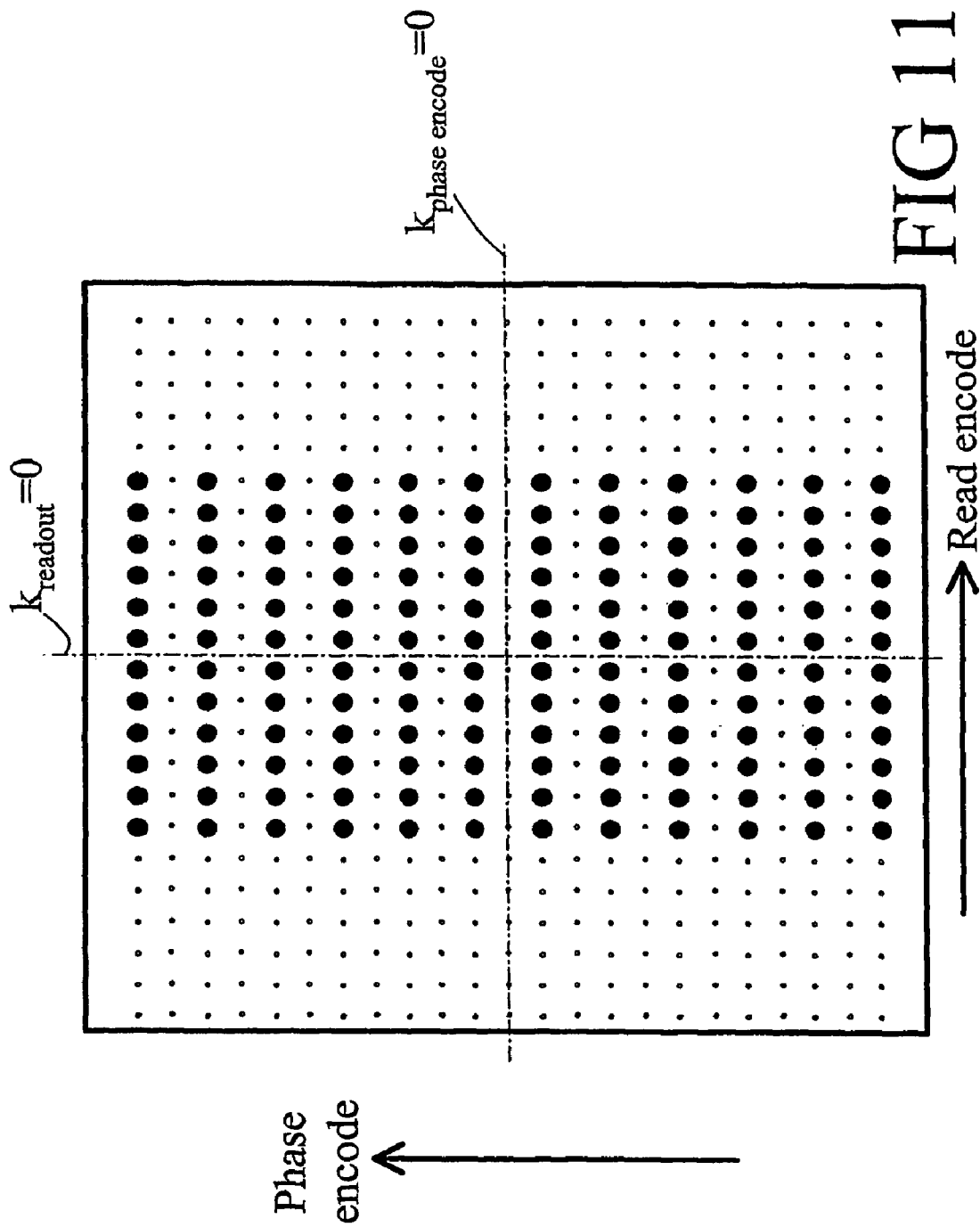

MR IMAGING WITH SENSITIVITY ENCODING IN THE READOUT DIRECTION

CROSS REFERENCE TO RELATED APPLICATIONS

This application claims the benefit of U.S. provisional application Ser. No. 60/479,758 filed Jun. 19, 2003, which is incorporated herein by reference.

The following relates to the diagnostic imaging arts. It finds particular application in magnetic resonance imaging at high speed, high resolution, or both, and will be described with particular reference thereto. However, it also finds application in magnetic resonance imaging generally, in magnetic resonance spectroscopy and in tailoring of ultrafast magnetic resonance sequences.

Motivated by a continuing desire to achieve higher image resolution and faster scan times, magnetic resonance imaging scanners have been developed that employ multiple radio frequency read coils to increase the rate of data acquisition and improve image quality. In a phased array approach, the receive coils are arranged to sample different regions of the imaging subject, with some overlap, to provide spatially parallel data acquisition.

In a sensitivity encoding approach, the different spatial sensitivities of the receive coils are exploited to reduce imaging time, or improve image resolution. Although sampling the same spatial volume using more than one coil might upon initial consideration appear to provide only redundant data, in fact it has been demonstrated that additional information content is acquired due to differences in the detection sensitivities of the coils. In sensitivity encoding (SENSE), imaging time is shortened by skipping phase encode steps. The reduced number of phase encode steps shortens imaging time by a SENSE factor corresponding to the reduction in the number of phase encode lines skipped. For example, if every other phase encode line is skipped, a SENSE factor of 2 is achieved.

The reduced number of sampled phase encode lines results in undersampling in the phase encode direction. If a fast Fourier transform reconstruction is performed over the full frequency range of k-space in the phase encode direction, the reconstructed image includes aliasing in which the undersampling of spatial frequencies results in reduced field of view image repetitions. The image field of view is reduced and the outlying image portions that correspond to higher spatial locations are aliased into the reduced field of view.

In SENSE, the folded reconstructed images acquired by the plurality of coils are combined to produce an unfolded image. The combining is based on sensitivity factors of the coils which cause images from each coil to have different phase-related artifacts. For example, if four coils are employed, the unfolded pixels are obtained by solving the set of linear equations:

$$P_1 = \rho_1 \cdot \beta_{1,1} + \rho_2 \cdot \beta_{1,2} + \rho_3 \cdot \beta_{1,3} + \rho_4 \cdot \beta_{1,4}$$

$$P_2 = \rho_1 \cdot \beta_{2,1} + \rho_2 \cdot \beta_{2,2} + \rho_3 \cdot \beta_{2,3} + \rho_4 \cdot \beta_{2,4}$$

$$P_3 = \rho_1 \cdot \beta_{3,1} + \rho_2 \cdot \beta_{3,2} + \rho_3 \cdot \beta_{3,3} + \rho_4 \cdot \beta_{3,4}$$

$$P_4 = \rho_1 \cdot \beta_{4,1} + \rho_2 \cdot \beta_{4,2} + \rho_3 \cdot \beta_{4,3} + \rho_4 \cdot \beta_{4,4} \quad (1)$$

where the value $P_x$ is the folded pixel value measured by coil x, $\beta_{x,y}$ is the sensitivity factor of coil x at unfolded pixel y, and $\rho_y$ are the unfolded spin density pixel values that are to be computed. The measured values $P_x$ correspond to the folded intermediate images and, for four coils, each pixel includes differing contributions from the four unfolded pixels $\rho_1, \rho_2, \rho_3, \rho_4$ due to aliasing in the phase encode direction attributable to undersampling and the coil properties. The spatial positions in the phase encode direction of the unfolded pixels $\rho_1, \rho_2, \rho_3, \rho_4$ is readily determined using Nyquist sampling theory. The coils sensitivity factors $\beta_{x,y}$ are obtained from calibration images of the imaging subject, which can be lower resolution images, or by collecting additional k-space views during image acquisition. Solution of Equation (1) for the unfolded pixel values $\rho_y$ is suitably performed on a pixel-by-pixel basis by any of a wide range of known linear equation solving techniques to produce the unfolded image with a full field of view. In one suitable approach, Equation (1) is written in a matrix format in which the sensitivity factors $\beta_{x,y}$ form a sensitivity matrix $[\beta]$, and solution of Equation (1) includes inverting the sensitivity matrix $[\beta]$.

In variable density SENSE, the distribution of sampled phase encode lines is distributed non-uniformly across k-space, preferably with a higher sampling density near the center of k-space and more sparse sampling in the outlying k-space extremities. As with conventional SENSE, the reconstructed images acquired by the various coils are combined using a set of linear equations that are solved for pixel values of the combined image.

These past methods of sensitivity encoding using multiple receive coils do not address certain remaining deficiencies in magnetic resonance imaging data acquisition, such as sampling rate limits imposed by limited sampling hardware speed, and limitations on imaging speed imposed by long read magnetic field gradient profiles that are used to sample k-space at high resolution.

The present invention contemplates an improved apparatus and method that overcomes the aforementioned limitations and others.

According to one aspect, a magnetic resonance imaging system is disclosed. A means is provided for encoding magnetic resonance in at least a readout direction. The encoding includes applying a read magnetic field gradient profile. A plurality of receive coils are provided for receiving magnetic resonance signals. A sampling means is provided for sampling the receive coils during application of the read magnetic field gradient profile to acquire samples from each receive coil at a measurement sampling rate. A means is provided for reconstructing the magnetic resonance samples acquired from each coil into a corresponding intermediate reconstructed image. The intermediate reconstructed images have a measurement field of view and a measurement spatial resolution in the readout direction. A means is provided for combining the intermediate reconstructed images based on coil sensitivity factors to produce a final reconstructed image having a final field of view and a final spatial resolution in the readout direction. At least one of the final field of view and the final spatial resolution is increased over a corresponding one of the measurement field of view and the measurement spatial resolution in the readout direction.

According to another aspect, a magnetic resonance imaging method is provided. Magnetic resonance signals are encoded in at least a readout direction with a read magnetic field gradient profile. The magnetic resonance signals are sampled in the readout direction using a plurality of receive coils to acquire magnetic resonance samples from each coil at a measurement sampling rate. The magnetic resonance samples acquired from each coil are reconstructed into a corresponding intermediate reconstructed image. The reconstructed images have a measurement field of view and a measurement spatial resolution in the readout direction. The intermediate reconstructed images are combined based on coil sensitivity factors to produce a final reconstructed image having a final field of view and a final spatial resolution in the readout direction. At least one of the final field of view and the final spatial resolution is increased over a corresponding one of the measurement field of view and the measurement spatial resolution in the readout direction.

One advantage resides in improved readout resolution for a given receiver bandwidth.

Another advantage resides in reduced readout time.

Yet another advantage resides in combining improved readout resolution with reduced readout time.

Numerous additional advantages and benefits will become apparent to those of ordinary skill in the art upon reading the following detailed description of the preferred embodiments.

The invention may take form in various components and arrangements of components, and in various process operations and arrangements of process operations. The drawings are only for the purpose of illustrating preferred embodiments and are not to be construed as limiting the invention.

FIG. 1 diagrammatically shows a magnetic resonance imaging system including a four-channel magnetic resonance receive coil for imaging with sensitivity-encoding in a selected one or both of the phase encode and readout directions.

Figure 2:
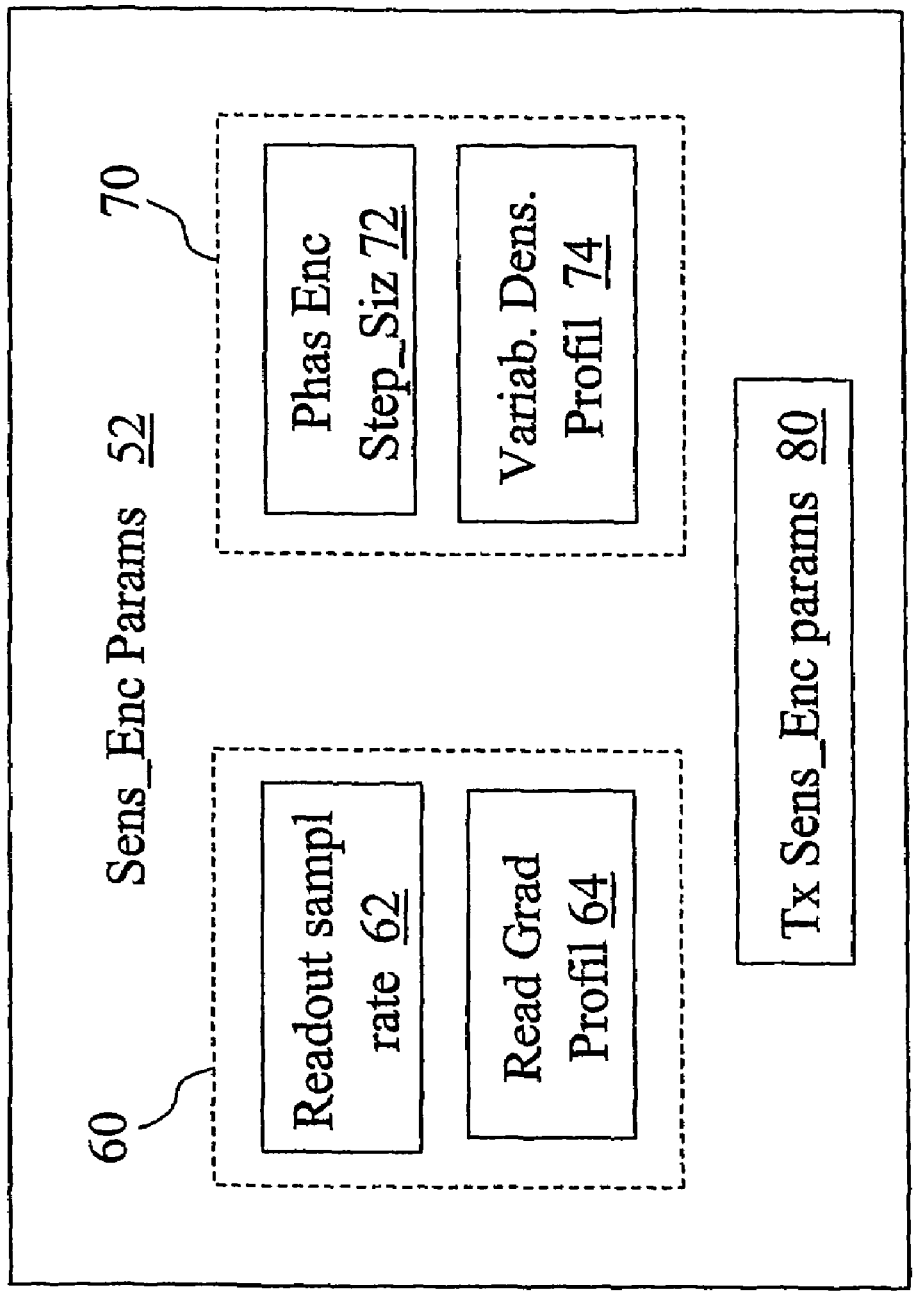

FIG. 2 diagrammatically shows configuration settings of the SENSE mode parameters memory of FIG. 1.

Figure 3:
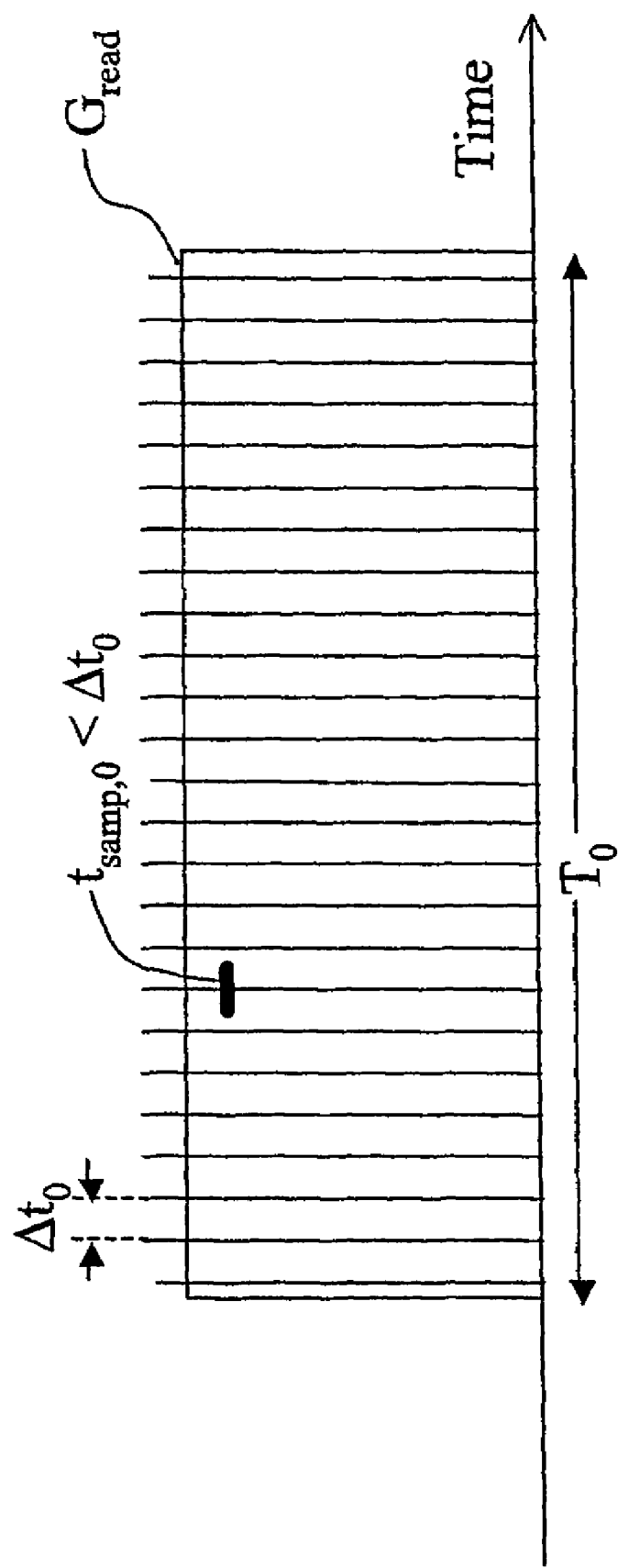

FIG. 3 diagrammatically shows a reference magnetic resonance readout that does not include sensitivity encoding.

Figure 4:
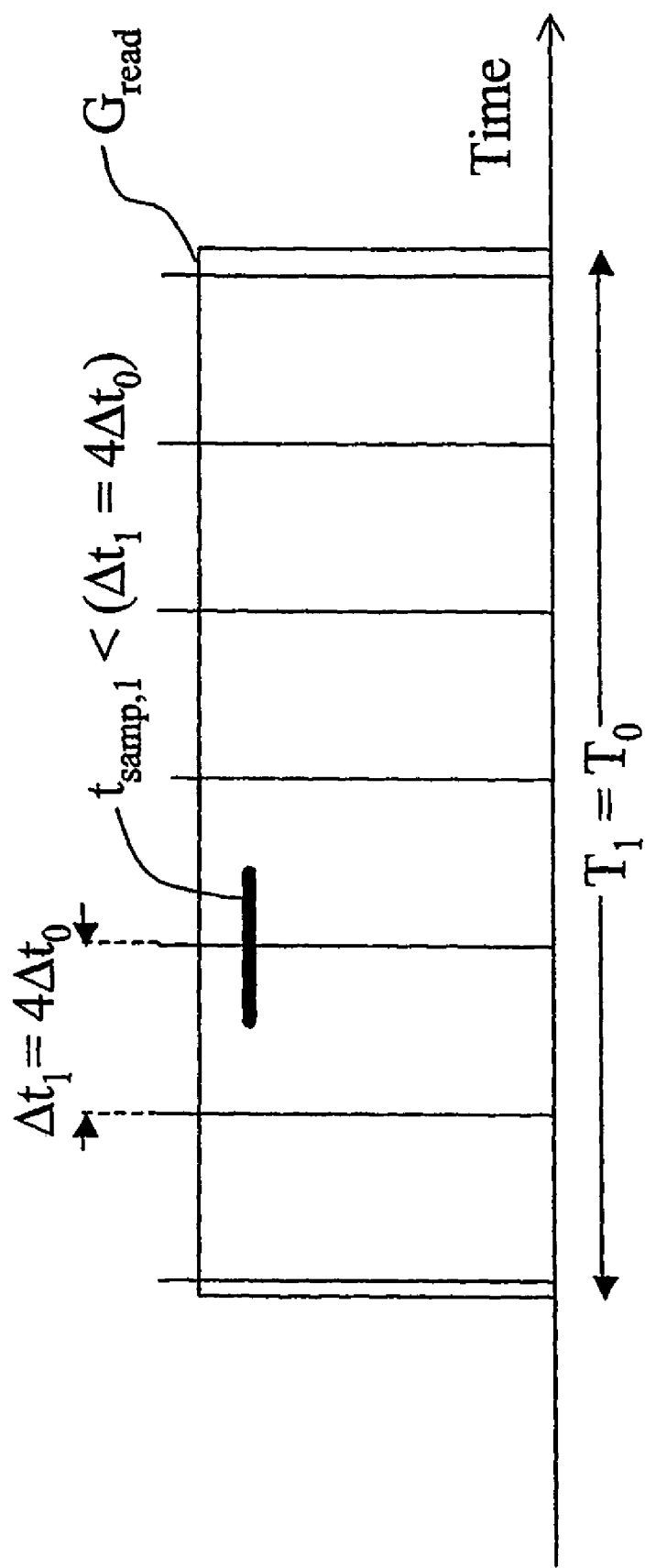

FIG. 4 diagrammatically shows a sensitivity encoding magnetic resonance readout that uses a reduced sampling rate to increase magnetic resonance sample read times.

Figure 5:
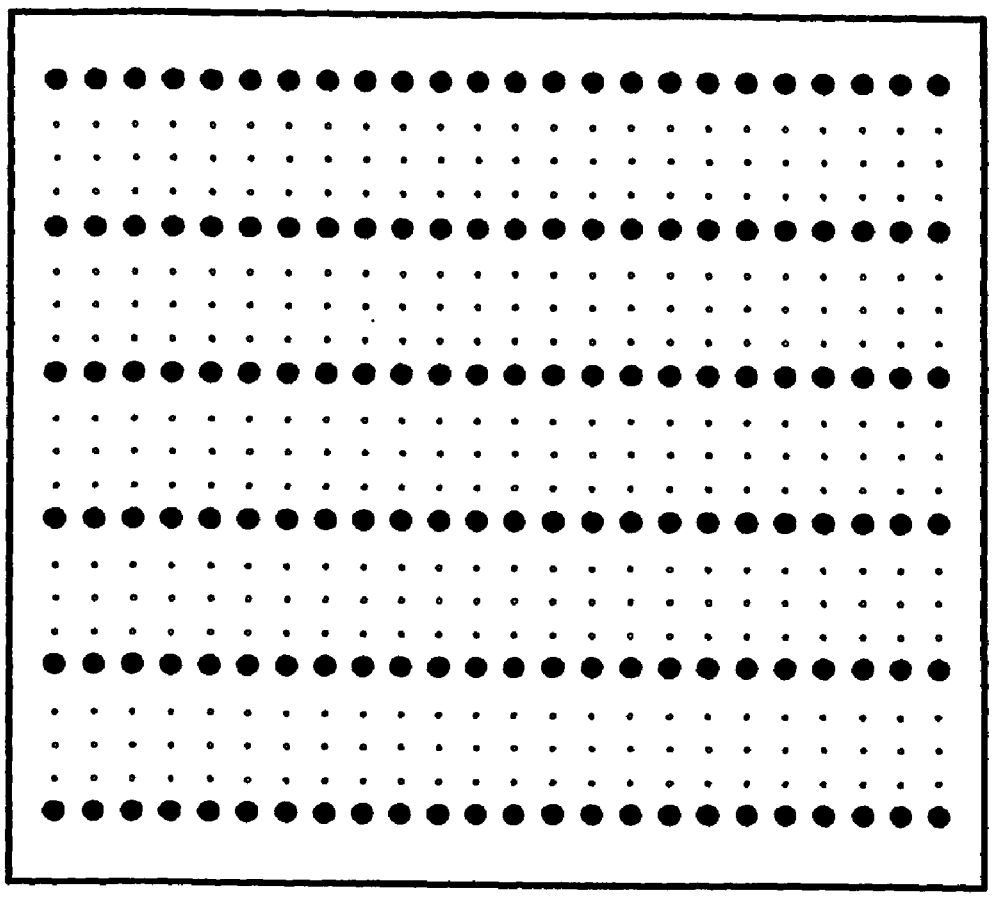

FIG. 5 diagrammatically shows k-space sampling for the sensitivity encoding magnetic resonance readout of FIG. 4.

Figure 6:
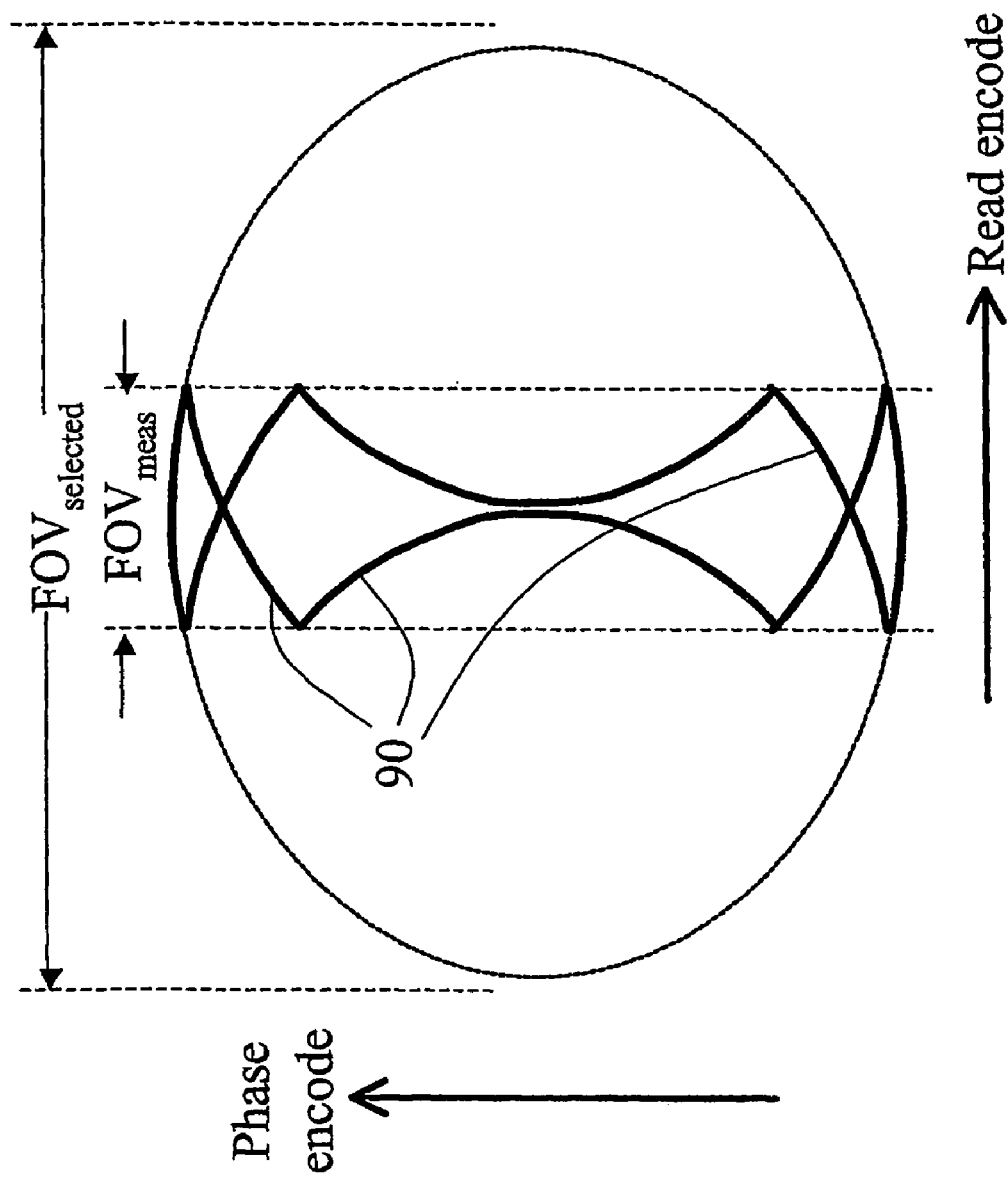

FIG. 6 diagrammatically shows folding of one of the intermediate reconstructed images generated by the sampling of FIGS. 4 and 5.

Figure 7:
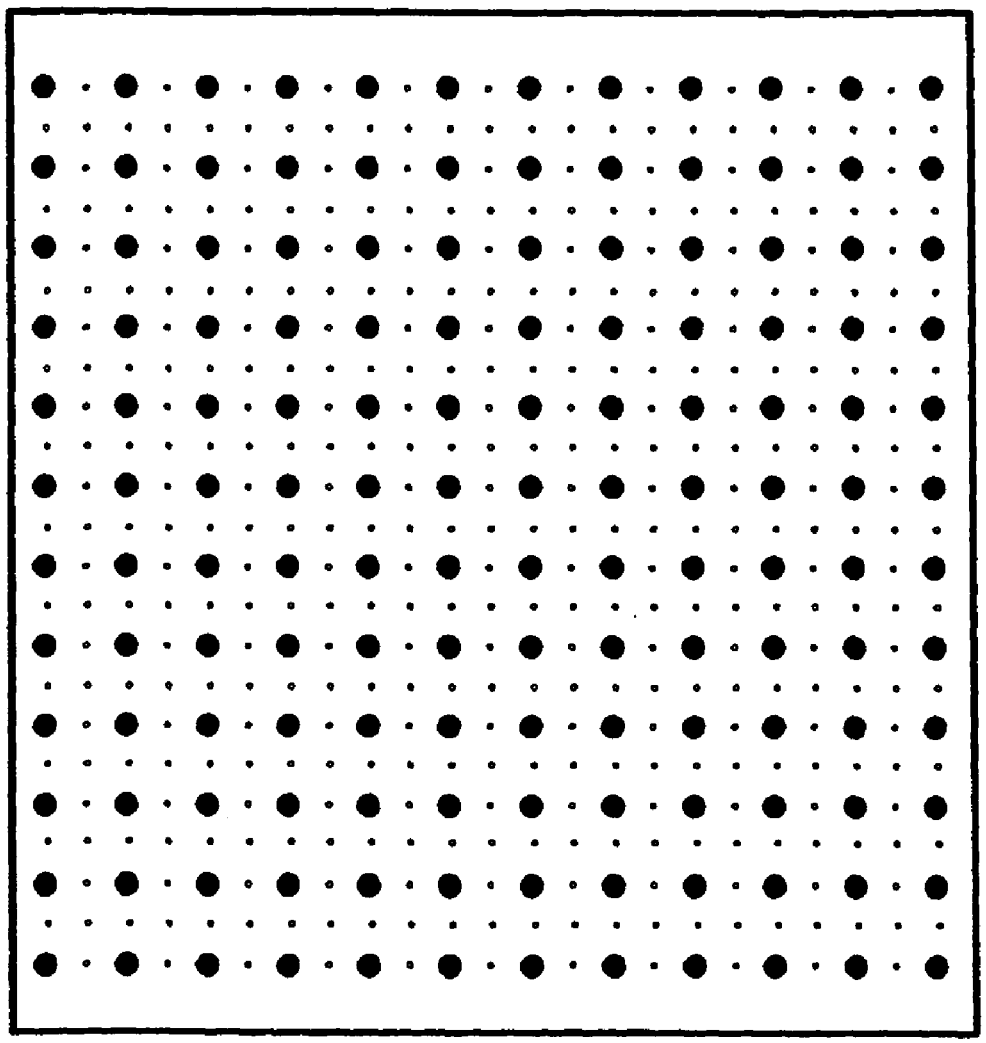

FIG. 7 diagrammatically shows k-space sampling for a sensitivity encoding combination in which both the readout and phase encode directions are sensitivity encoded using a reduced sampling rate in the readout direction and an increased phase encode step size in the phase encode direction.

Figure 8:
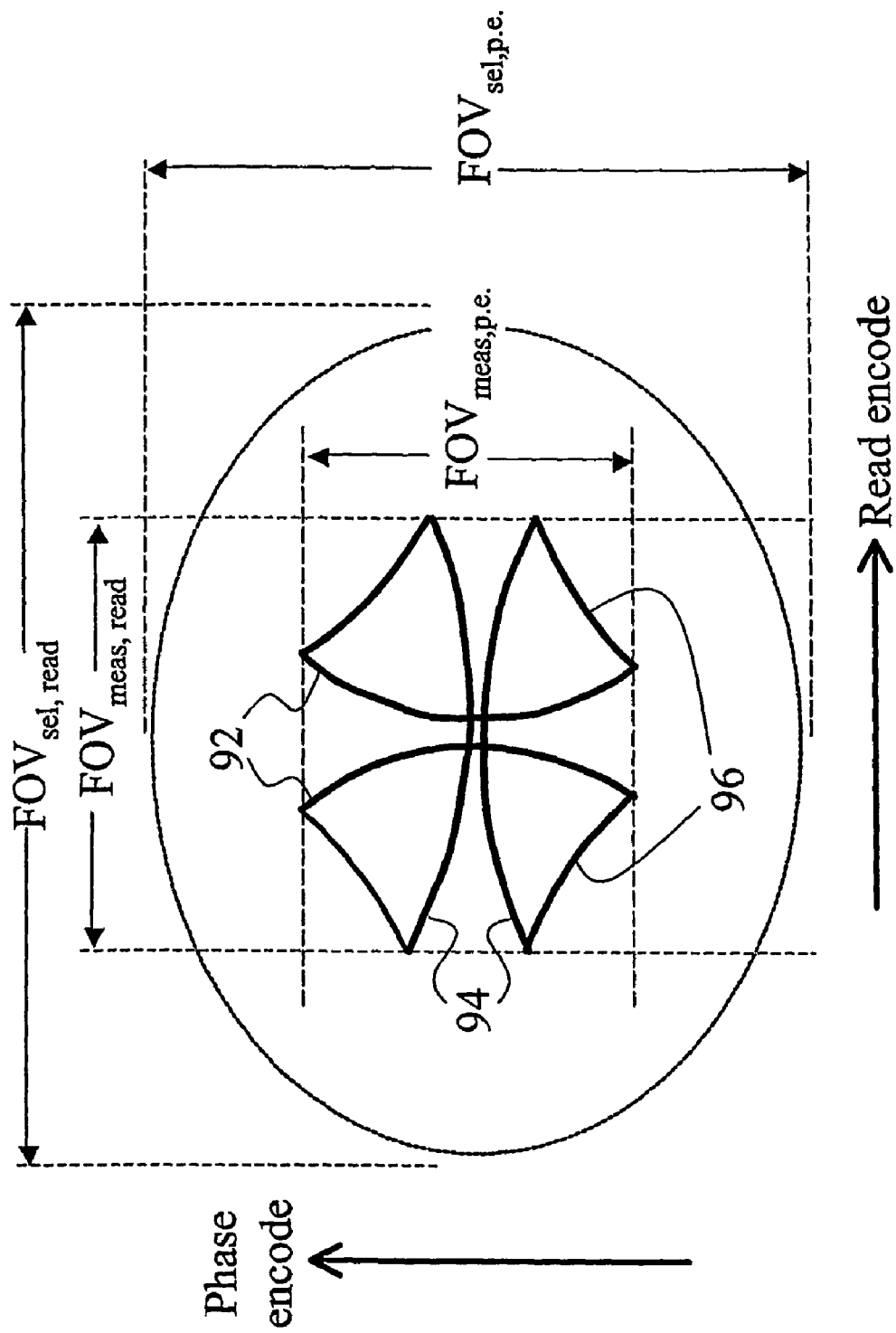

FIG. 8 diagrammatically shows folding of one of the intermediate reconstructed images generated by the sampling of FIG. 7.

Figure 9:
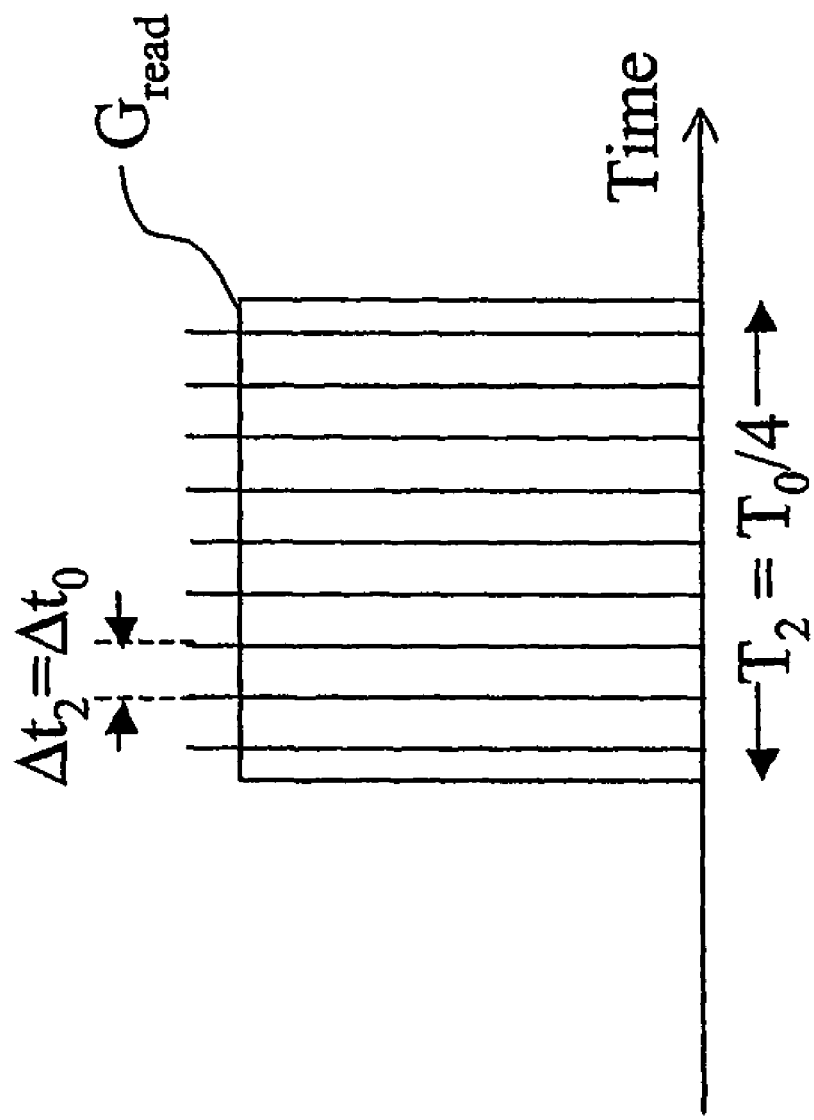

FIG. 9 diagrammatically shows a sensitivity encoding magnetic resonance readout that uses a shortened read magnetic field gradient profile to reduce readout time.

Figure 10:
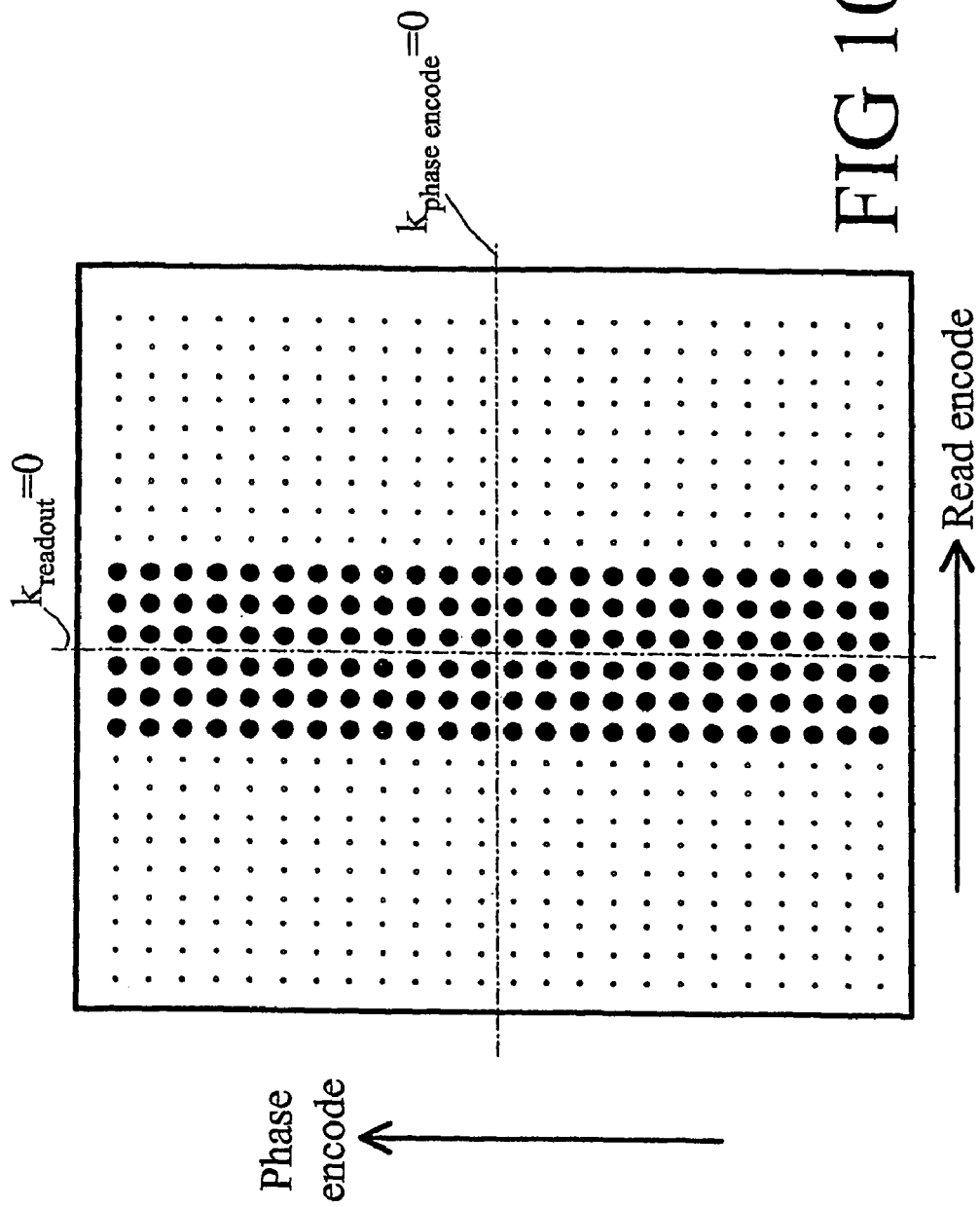

FIG. 10 diagrammatically shows k-space sampling for the sensitivity encoding magnetic resonance readout of FIG. 9.

FIG. 11 diagrammatically shows k-space sampling for a sensitivity encoding combination in which the readout direction is sensitivity encoded using a shortened read magnetic field gradient profile in the readout direction and an increased phase encode step size in the phase encode direction.

With reference to FIG. 1, a magnetic resonance imaging system includes a magnetic resonance imaging scanner 10, which in the exemplary embodiment is an Intera 3.0T short-bore, high-field (3.0T) magnetic resonance imaging scanner available from Philips Corporation. However, substantially any magnetic resonance imaging scanner can be used that includes a main magnet, gradient coils for providing slice, phase encode, and readout magnetic field gradients, and a radio frequency transmitter for exciting nuclear magnetic-resonances in an imaging subject. The Intera 3.0T is advantageously configured to provide whole-body imaging; however, scanners that image smaller fields of view can also be employed, as well as scanners that provide lower main magnetic fields and/or have a longer bore or an open bore.

The magnetic resonance imaging scanner 10 provides a constant main magnetic field in an axial or z-direction within an examination region 12. In a typical magnetic resonance imaging sequence implemented by the scanner 10, a slice-select gradient is applied in the z-direction, although phase encoding in the z-direction is also contemplated. While the slice-select gradient is extant, a radio frequency excitation pulse or pulse packet is transmitted into the examination region 12 of the scanner 10 to excite magnetic resonance in an axial slice of an imaging subject. The axial slice is selected by the slice-select gradient. Some time after removal of the radio frequency excitation and the slice-select gradient, a phase encode magnetic field gradient is applied along a phase encode or y-direction that is generally transverse to the axial or z-direction to phase encode the magnetic resonance of the excited slice along the phase encode direction. Some time after removal of the phase encode magnetic field gradient, a read magnetic field gradient profile is applied along an x-direction that is generally transverse to the y- and z-directions. During application of the read magnetic field gradient profile, magnetic resonance samples are acquired in the x-direction, which is also called the readout direction. Typically, the magnetic resonance imaging sequence includes a succession of alternating phase encode gradients and read gradients that cycle the magnetic resonance sampling through k-space.

The described magnetic resonance imaging sequence is exemplary only. Those skilled in the art can readily modify the described sequence to comport with specific applications. The sequence optionally includes other features, such as one or more 180° inversion pulses, one or more magnetic resonance spoiler gradients, and so forth. Moreover, the orientation of the slice-select, phase encode, and readout directions is arbitrary. For example, the slice-select direction can be other than the z-direction shown in FIG. 1. For convenience, the x-, y-, and z-directional notation set forth above is used for explanatory purposes herein. Those skilled in the art will recognize that the sensitivity encoding techniques described herein are generally applicable to increase sampling resolution and/or reduce imaging time for substantially any type of magnetic resonance imaging sequence.

The magnetic resonance imaging scanner 10 includes a multiple-receive coil array 14 which in the exemplary embodiment includes four receive coils. Other numbers of receive coils can be employed; for example, an eight-channel sensitivity encoding (SENSE) head coil that includes eight receive coils defining eight SENSE receive channels is available from Philips Corporation. An odd number of receive coils can also be employed. Indeed, substantially any number of coils greater than one can be employed; however, employing four or more coils provides additional flexibility.

During application of the read magnetic field gradient profile, a sampling circuit 16 uses the four channels of the multiple-receive coil array 14 to acquire magnetic resonance samples at a selected measurement sampling rate. For example, at a measurement sampling rate of 200 kHz corresponding to a sampling interval of 5 μs, during each 5 μs sampling interval four samples are acquired, one sample by each of the four coils of the multiple-receive coil array 14. The coils of the multiple-receive coil array 14 sample substantially the same spatial region of the examination region 12. The acquired magnetic resonance samples are stored in k-space memories 20, 22, 24, 26 that correspond to the four receive coils of the receive coils array 14.

A reconstruction processor 30 performs a fast Fourier transform reconstruction of the magnetic resonance samples of each of the four k-space memories 20, 22, 24, 26, to generate corresponding intermediate reconstructed images that are stored in intermediate image memories 32, 34, 36, 38. In FIG. 1 a single reconstruction processor 30 provides time-multiplexed or parallel processing of the four image reconstructions. It is also contemplated to, include a separate Fourier transform reconstruction processor for each of the k-space memories 20, 22, 24, 26. The intermediate reconstructed image stored in the image memory 32 is reconstructed from magnetic resonance samples stored in the k-space memory 20 which are acquired by a single receive coil of the coils array 14. Similarly: the intermediate reconstructed image stored in the image memory 34 is reconstructed from magnetic resonance samples stored in the k-space memory 22 which are acquired by another receive coil; the intermediate reconstructed image stored in the image memory 36 is reconstructed from magnetic resonance samples stored in the k-space memory 24 which are acquired by yet another receive coil; and the intermediate reconstructed image stored in the image memory 38 is reconstructed from magnetic resonance samples stored in the k-space memory 26 which are acquired by still yet another receive coil.

The intermediate reconstructed images are undersampled in the readout direction, and are optionally also undersampled in the phase encode direction. Although the desired image has a selected field of view and a selected resolution, the undersampling in the readout direction corresponds to a smaller field of view such that each intermediate reconstructed image produces at least one of a reduced field of view in the readout direction compared with the selected image characteristics. Additionally, higher spatial frequencies are optionally not sampled in the readout direction, in which case the intermediate images will also have a reduced resolution compared to that desired for the target image.

A sensitivity decoding processor 40 combines the intermediate reconstructed images based on a set of coils sensitivity parameters [β] 42 to compute a final reconstructed image 44 that has the selected field of view and the selected image resolution in the readout direction. Similarly, the image combining performed by the sensitivity decoding processor 40 corrects for a reduced field of view or other image degradation introduced by optional undersampling in the phase encode direction. The coil sensitivity parameters of the sensitivities matrix [β] 42 are computed a priori by a coils sensitivities processor 46 based on low resolution images. In a preferred approach, an image acquired using a whole-body coil (not shown) is used as a uniformity reference in determining the sensitivity parameters [β] 42 of the coils of the multiple-receive coil array 14.

A user interface 50 receives the final reconstructed image 44 and performs suitable image processing to produce a human viewable display image that is displayed on a display monitor of the user interface 50. For example, a two-dimensional slice or a three-dimensional rendering can be produced and displayed. Alternatively or in addition, the final reconstructed image 44 can be printed on paper, stored electronically, transmitted over a local area network or over the Internet, or otherwise processed.

The user interface 50 preferably also enables an associated radiologist or other user to select sensitivity encoding parameters that are stored in a sensitivity encoding parameters memory 52. The user interface 50 preferably further enables the associated radiologist or other user to communicate with a magnetic resonance imaging sequence controller 54 that controls the magnetic resonance scanner 10 to perform selected magnetic imaging sequences that employ a sensitivity encoding or combination of sensitivity encodings specified by contents of the sensitivity encoding parameters memory 52.

With continuing reference to FIG. 1 and with further reference to FIG. 2, the sensitivity encoding parameters memory 52 stores parameters for implementing various sensitivity encoding schemes and combinations of sensitivity encoding schemes. A readout sensitivity encoding parameters set 60 includes a readout measurement sampling rate 62 which is optionally reduced compared with a sampling rate sufficient to provide the selected final image resolution. The sampling rate is, preferably, slow enough that the sampling hardware can sample with a maximum number of bits per sample. The readout sensitivity encoding parameters set 60 also includes a read gradient profile parameter 64 that specifies a read magnetic field gradient profile area. In a preferred embodiment, the read magnetic field gradient profile is a square profile having a fixed gradient amplitude $G_{read}$, and the read gradient profile parameter 64 specifies a temporal length of the read magnetic field gradient profile. The sensitivity encoding parameters memory 52 also stores a phase encode sensitivity encoding parameters set 70, including a phase encoding step size 72 for implementing conventional phase encoding SENSE, and a variable phase encoding step density profile 74 for implementing variable density phase encoding SENSE. Optionally, the sensitivity encoding parameters memory 52 further includes a transmit sensitivity encoding parameters set 80.

The exemplary four coils of the multiple-receive coil array 14 provide a factor of four increase in the number of samples obtained for a given magnetic resonance imaging sequence. This fourfold increase in sampling can be used for various types of coil sensitivity encoding in the readout direction, the phase encoding direction, or both. Several preferred sensitivity encoding schemes are discussed below.

As will also be demonstrated, readout sensitivity encoding is optionally combined with sensitivity encoding in the phase encode direction; however, such combinations are limited by the number of receive coils. With four coils, if conventional phase encode SENSE is employed with a SENSE factor of four, then the fourfold increase in sampling provided by the exemplary four coils of the multiple-receive coil array 14 is entirely applied to the phase encode direction, and additional sensitivity encoding in the readout direction is unavailable. On the other hand, if conventional phase encoding SENSE is employed with a SENSE factor of only two, then a twofold portion of the fourfold increase in sampling is effectively applied for the phase encoding SENSE, and the remaining twofold sampling increase is available for sensitivity encoding in the readout direction. In yet another scheme, the entire fourfold sampling increase is applied to sensitivity encoding in the readout direction, in which case sensitivity encoding in the phase encode direction is unavailable. For the general case of N receive coils, the N-fold increase in sampling can be applied entirely to sensitivity encoding in the readout direction, or the N-fold increase in sampling can be applied entirely to sensitivity encoding in the phase encode direction, or the N-fold increase in sampling can be distributed between the readout and phase encode directions.

FIG. 3 shows a conventional reference magnetic resonance readout in which sensitivity encoding in the readout direction is not applied. In this conventional magnetic resonance readout, a read magnetic field gradient profile having a gradient magnitude $G_{read}$ and a duration $T_0$ is applied, during which magnetic resonance samples (indicated diagrammatically by vertical lines in FIG. 3) are acquired at a sampling interval $\Delta t_0$. The read magnetic field gradient magnitude $G_{read}$ determines a range of resonance frequencies over which the selected field of view is encoded. In other words, the gradient magnitude $G_{read}$ determines the extent of the k-space. The magnetic resonance sampling rate $1/\Delta t_0$ is high enough to avoid aliasing for the frequency range defined by the read magnetic field gradient magnitude $G_{read}$. Moreover, the area $G_{read} \cdot T_0$ of the read magnetic field gradient profile is proportional to the spatial resolution in the readout direction. The gradient profile duration $T_0$ is selected to provide a selected spatial resolution in the readout direction.

With continuing reference to FIG. 3 and with further reference to FIGS. 4-6, a first preferred sensitivity encoding scheme in the readout direction is described, in which the entire fourfold increase in sampling due to the four coils is applied in the readout direction. In this technique, the field of view is compromised during sampling, but the field of view is recovered during an unfolding operation. As seen in FIG. 4, the read magnetic field gradient profile is unaltered; that is, the gradient magnitude remains at $G_{read}$ and the gradient duration remains $T_0$ (that is, $T_1=T_0$). However, a sampling interval $\Delta t_1$ of the magnetic resonance sampling in FIG. 4 is four times larger than the sampling interval $\Delta t_0$ of FIG. 3. That is, a sampling rate $1/\Delta t_1$ of the magnetic resonance sampling in FIG. 4 is only one-fourth as large as the sampling rate $1/t_0$ of FIG. 3. Slower sampling can be advantageous to increase the number of digitized bits of each sample.

FIG. 5 shows the effect of this reduction in sampling rate in k-space. In the readout direction, only one-fourth of the k-space samples are acquired at the reduced sampling rate $1/\Delta t_1$ of the sensitivity encoded readout of FIG. 4, as compared with the reference readout of FIG. 3. In FIG. 5, the k-space samples acquired by the readout of FIG. 4 are shown as large filled circles, while the k-space samples that are skipped by the reduced sampling rate $1/\Delta t_1$ of the readout of FIG. 4 are indicated by small dots. The reference readout of FIG. 3 acquires all samples, both those indicated by the large filled circles and those indicated by the small dots.

FIG. 6 diagrammatically shows the folding of one of the folded intermediate reconstructed images that are obtained using the sensitivity encoding of FIGS. 4 and 5. A field of view $FOV_{meas}$ of the intermediate reconstructed image is only one-fourth as large as the selected field of view $FOV_{selected}$ that is acquired by the readout of FIG. 3. This reduced field of view results from reducing the sampling density of the spatial frequencies. Areas of the selected field of view that lie outside the reduced measurement field of view $FOV_{meas}$ (represented in phantom in FIG. 6) are frequency encoded by frequency components that are not adequately sampled. The undersampled frequency components manifest as folded or aliased features 90 in the intermediate reconstructed image of FIG. 6.

Those skilled in the art will recognize some similarities between the k-space sampling shown in FIG. 5 and the folded image of FIG. 6, on the one hand, and k-space sampling and image folding obtained by conventional phase encode SENSE on the other hand. Phase encode SENSE using a SENSE factor of four corresponds to recording only every fourth phase encode line, and produces a folded image with a field of view in the phase encode direction reduced by a factor of four, and folding in the phase encode direction.

This similarity extends to the image combining. The aliasing in the readout direction introduced by the readout sensitivity encoding of FIGS. 4-6 is removed by the sensitivity decoding processor 40, which acts as an unfolding processor to unfold the folded intermediate reconstructed images. A system of linear equations similar to Equation (1) is suitably employed, except that the unfolded spin density pixels $\rho_1$, $\rho_2$, $\rho_3$, $\rho_4$ are aliased along the readout or x-direction. The positions of the spin density pixels $\rho_1$, $\rho_2$, $\rho_3$, $\rho_4$ in the readout direction are suitably determined using Nyquist sampling theory. The resulting unfolded final image does not have aliasing in the readout direction, and the selected field of view of the final image is four times larger than the measured field of view $FOV_{meas}$.

Despite these apparent similarities, however, the readout sensitivity encoding of FIGS. 4-6 has a very different effect on the imaging from conventional phase encode SENSE, and provides a very different engineering advantage. As is known by those skilled in the art, conventional phase encode SENSE provides reduced imaging time by reducing the number of phase encode lines that are sampled. In contrast, the readout sensitivity encoding described with reference to FIGS. 4-6 provides no reduction in imaging time. The number of phase encode lines is not reduced, and the readout time for each phase encode line is set by the read gradient duration $T_1$, which is also not modified by the readout sensitivity encoding.

Instead, the readout sensitivity encoding shown in FIGS. 4-6 provides for increased magnetic resonance sample read times. In the imaging of FIG. 3 with no readout sensitivity encoding, a magnetic resonance sample read time $t_{samp,0}$ is less than the corresponding sampling interval $\Delta t_0$. In FIG. 4 the magnetic resonance sample read time $t_{samp,1}$ is similarly less than the corresponding sampling interval $\Delta t_1$. However, since $\Delta t_1 = 4 \Delta t_0$, it follows that the magnetic resonance sample read time $t_{samp,1}$ with readout sensitivity encoding shown in FIG. 4 can be increased by about a factor of four compared with the reference magnetic resonance sample read time $t_{samp,0}$.

The sensitivity encoding of FIGS. 4-6 can be used in at least two different ways. A first application is illustrated by directly comparing FIG. 4 with FIG. 3. Here, the sampling interval is increased from $\Delta t_0$ to $\Delta t_1$. This provides the longer magnetic resonance sample read time $t_{samp,1}$, which translates into a more accurate measurement of the magnetic resonance. sample. The number of bits of the digitized sample, which corresponds to the amplitude resolution of the magnetic resonance sample, is determined by sampling time. In other words, the intensity gray scale depth of the final reconstructed image is increased.

A second application of the sensitivity encoding of FIGS. 4-6 is advantageous for magnetic resonance imaging systems in which the readout sampling rate is hardware-limited by the speed of the radio frequency sampling processor 16. Without the sensitivity encoding of FIGS. 4-6, the hardware limit on sampling rate translates into a limit on field of view in the readout direction for a given read magnetic field gradient amplitude $G_{read}$. In this second application, the sampling rate is kept high, for example at $\Delta t_0$, and readout sensitivity encoding is used to provide a fourfold increase in the field of view over the measured field of view $FOV_{meas}$ through image unfolding.

With reference to FIGS. 7 and 8, another sensitivity encoding embodiment is described, in which the readout sensitivity encoding of FIGS. 4-6 is combined with conventional phase encode SENSE. This combination provides the read time advantage of reduced-sampling rate readout sensitivity encoding along with reduced imaging time provided by the phase encode SENSE. FIG. 7 shows the k-space map for such sampling relative to sampling by the reference readout of FIG. 3. Similarly to FIG. 5, in FIG. 7 skipped k-space samples are indicated by small dots, while acquired k-space samples are indicated by large filled circles.

To apply sensitivity encoding in the phase encode direction, the sensitivity encoding in the readout direction is reduced from a fourfold decrease in sampling to a twofold decrease in sampling. That is, the readout sampling interval is twice the sampling interval $\Delta t_0$ of FIG. 3, or equivalently the readout sampling rate is one-half the sampling rate $1/\Delta t_0$ of FIG. 3. The remaining twofold sampling increase provided by the four receive coils is applied to the phase encode direction to enable a SENSE factor of two in the phase encode direction. Thus, imaging time is reduced by about a factor of two due to the phase encode SENSE, while the magnetic resonance sample read time can be increased by about a factor of two compared with the read time $t_{samp,0}$ of the reference readout shown in FIG. 3.

FIG. 8 diagrammatically shows the folding of one of the folded intermediate reconstructed images corresponding to the k-space sampling of FIG. 7. A field of view $FOV_{meas, read}$ of the intermediate reconstructed image in the readout direction is only one-half as large as the selected readout field of view $FOV_{sel,read}$ that is acquired by the readout of FIG. 3, due to the halving of the readout sampling rate. Additionally, as is usual for conventional phase encode SENSE, a field of view $FOV_{meas, p.e.}$ in the phase encode direction is also reduced by one-half compared with a selected phase encode field of view $FOV_{sel,p.e.}$ due to the skipped phase encode lines. The undersampling in the readout direction manifests as folded or aliased features 92 in the intermediate reconstructed image of FIG. 8. The undersampling in the phase encode direction leads to folded or aliased features 94 in the intermediate reconstructed image of FIG. 8. Still further folded or aliased features 96 result from combined undersampling in the readout and phase encode directions. Equation (1) is readily adapted to sum the unfolded pixels along both the phase encode direction and the readout direction that contribute to each measured pixel of the intermediate reconstructed image, and the sensitivity decoding processor 40 constructs and solves the modified sets of linear equations to compute the unfolded spin density pixel values ρ.

With reference to FIGS. 9 and 10, in yet another preferred sensitivity encoding scheme, reduced readout sampling is obtained by shortening or truncating the read magnetic field gradient profile. In this technique, resolution is compromised during readout for greater readout speed, but the resolution is recovered in the unfolding operation. Comparing FIG. 9 with reference FIG. 3, a sampling interval $\Delta t_2$ of the sensitivity encoded readout of FIG. 9 is the same as the sampling interval $\Delta t_0$ of the reference readout of FIG. 3. That is, $\Delta t_2 = \Delta t_0$. Since the sampling rate is unchanged, spatial frequency components are adequately sampled and the field of view is not reduced. However, the readout of FIG. 9 has a read gradient duration $T_2$ that is only one-quarter of the read gradient duration $T_0$ of the reference readout of FIG. 3. Since the reconstructed image spatial resolution is proportional to the area of the gradient profile, the reduced gradient duration $T_2$ results in intermediate reconstructed images of reduced spatial resolution in the readout direction compared with an image reconstructed from the sampling of FIG. 3.

FIG. 10 shows the sampling of FIG. 9 in k-space. Only a central one-fourth portion of k-space centered around $k_{readout}=0$ is sampled in the readout direction, with no sampling of high readout k values.

Those skilled in the art will recognize some similarities between the k-space sampling shown in FIG. 10, on the one hand, and k-space sampling obtained by variable density phase encode SENSE on the other hand. Variable density phase encode SENSE samples more sparsely at high phase encode k values, and concentrates the phase encode lines toward the central region of k-space, that is, around $k_{phase\ encode}=0$. Moreover, both the readout sampling of FIGS. 9 and 10 and the variable density phase encode SENSE technique have as principle advantages a substantial reduction in imaging time.

However, unlike variable density phase encode SENSE, the readout sensitivity encoding of FIGS. 9 and 10 completely omits sampling of high readout k-values. Complete omission shortens imaging time by shortening the read gradient profile duration $T_2$. In the readout sensitivity encoding of FIGS. 9 and 10, imaging time is determined by the gradient duration $T_2$. Including even a single high readout k value extends the gradient duration $T_2$ out to that k value, which substantially eliminates the reduction in imaging time obtained with the compact readout sensitivity encoding of FIGS. 9 and 10.

Those skilled in the art will recognize that complete omission of high phase encode k values provides no similar advantage in variable density phase encode SENSE. Inclusion of a few high phase encode k values in variable density phase encode SENSE does not require a similar gradient extension. In the phase encode direction, complete omission of high phase encode k values does not provide a substantial imaging time advantage over a variable distribution of phase encode lines concentrated near the center of k-space but including some high k values. This is because in phase encode SENSE the reduction in imaging time corresponds to the reduction in the number of sampled phase encode lines, and does not strongly relate to the distribution of the retained phase encode lines in k-space.

To overcome the reduction in spatial resolution introduced by the shortened readout magnetic field gradient profile of FIG. 9, the sensitivity decoding processor 40 combines the several low resolution intermediate reconstructed images to produce the final reconstructed image with high spatial resolution. For this combination, Equation (1) is preferably adapted and rewritten in a matrix format as:

$$\underline{P}(k_x) = \underline{\beta}(r_x, k_x)\underline{\rho}(r_x) \qquad (2)$$

where $k_x$ indexes readout k values, $\underline{P}(k_x)$ contains the measured pixel values of the intermediate reconstructed images, $\underline{\rho}(r_x)$ contains true pixel values of a column $r_x$ of the final reconstructed image, and $\underline{\beta}(r_x, k_x)$ contains the coil sensitivities along the image column $r_x$ and the corresponding k values $k_x$. The coil sensitivity terms of the $\underline{\beta}(r_x, k_x)$ matrix contain Fourier transformation terms which correspond to analogous Fourier transformation terms used in variable density phase-encoding SENSE. These Fourier terms are included because the intermediate images are Fourier transformed only in the phase encode direction, and not in both the phase encode and readout directions as is the case in Equation (1). The desired true spin density pixel values $\underline{\rho}(r_x)$ are suitably extracted by the sensitivity decoding processor 40 by inverting the sensitivities matrix $\underline{\beta}(r_x, k_x)$. Since the k values typically extend over 128, 256, or 512 k-space samples, regularization techniques are preferably employed in inverting the sensitivities matrix $\beta(r_x, k_x)$. However, the matrix inversion advantageously is performed only once for each column $r_x$.

A problem can arise in solving Equation (2) due to the complete omission of high readout k values in the sampling of FIGS. 9 and 10. If the coils have low sensitivities at high spatial frequencies, the sensitivities matrix $\beta(r_x, k_x)$ can be ill-conditioned, making the matrix inversion inexact or impractical. Preferably, the coils of the multiple-receive coil array 14 are designed to provide large sensitivities at high spatial frequencies to overcome this problem.

With reference to FIG. 11, still yet another sensitivity encoding embodiment is described, in which the readout sensitivity encoding of FIGS. 9 and 10 is combined with conventional phase encode SENSE. This combination provides the imaging time reduction of reduced gradient duration readout sensitivity encoding along with an additional reduction in imaging time provided by the phase encode SENSE. FIG. 11 shows the k-space map for such sampling relative to sampling by the reference readout of FIG. 3. As in the other k-space maps, in FIG. 11 skipped k-space samples are indicated by small dots, while acquired k-space samples are indicated by large filled circles.

Once again, to apply sensitivity encoding in the phase encode direction, the sensitivity encoding in the readout direction is reduced from a fourfold decrease in sampling to a twofold decrease in sampling. That is, a central one-half of k-space centered around $k_{readout}=0$ is sampled in the readout direction. The remaining twofold sampling increase provided by the four receive coils is applied to the phase encode direction to enable a phase encode SENSE factor of two.

In another contemplated approach, the reduced gradient duration readout sensitivity encoding of FIGS. 9 and 10 is combined with transmit SENSE using the transmit sensitivity encoding parameters set 80 (see FIG. 2). Transmit SENSE shortens spatially selective radio frequency pulses, which are based on trajectories through the excitation k-space. Combining transmit SENSE with the reduced gradient duration readout sensitivity encoding of FIGS. 9 and 10 can shorten slice selection pulses, which are spatially selective pulses with trajectories in one dimension through the excitation k-space. Although a one-dimensional slice-select transmit SENSE is described, transmit SENSE can also be applied in two- or three-dimensional pulses. This combination is particularly advantageous for shortening ultra-fast magnetic resonance imaging sequences in which the slice selection pulse is a significant fraction of the sequence repetition time TR.

Similarly, the reduced gradient duration readout sensitivity encoding of FIGS. 9 and 10 can be applied to shorten magnetic resonance spectroscopy measurements. If the coils of the multiple-receive coil array 14 are designed to provide good sensitivities at high spatial frequencies, the coil array 14 enables reconstruction of the missing parts of the spectra.

With reference to FIGS. 7, 8, and 11, two example of combining sensitivity encoding in the readout direction with sensitivity encoding in the phase encode direction have been described. In both these examples, a conventional phase encoding SENSE is applied in the phase encode direction. However, it will be appreciated that variable density phase encoding SENSE can be substituted for the conventional phase encoding SENSE in these and similar combinations.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having described the preferred embodiments, the invention is now claimed to be:

1. A magnetic resonance imaging system including:
    a magnetic resonance imaging scanner configured to encode magnetic resonance in at least a readout direction, the encoding including applying a read magnetic field gradient profile;
    a plurality of receive coils for receiving magnetic resonance signals;
    a sampling means for sampling the receive coils during application of the read magnetic field gradient profile in order to acquire samples from each receive coil at a measurement sampling rate, wherein the sampling means undersamples the receive coils at a reduced sampling rate such that the intermediate reconstructed images include aliasing in at least the readout direction;
    a means for reconstructing the magnetic resonance samples acquired from each coil into a corresponding intermediate reconstructed image, the intermediate reconstructed images having a measurement field of view and a measurement spatial resolution in the readout direction; and
    a means for combining the intermediate reconstructed images based on coil sensitivity factors in order to produce a final reconstructed image having a final field of view in the readout direction that is increased over the measurement field of view in the readout direction.

2. The magnetic resonance imaging system as set forth in claim 1, further including:
    a coils sensitivities processor that computes coils sensitivities data based on a calibration image.

3. The magnetic resonance imaging system as set forth in claim 2, wherein the combining means solves a set of linear equations relating pixel values of the intermediate reconstructed images and coils sensitivities data computed by the coils sensitivities processor to compute a pixel value of the final reconstructed image.

4. The magnetic resonance imaging system as set forth in claim 1, wherein the magnetic resonance imaging scanner encodes magnetic resonance samples in both phase encode and readout directions.

5. The magnetic resonance imaging system as set forth in claim 4, wherein the sampling means also acquires magnetic resonance samples encoded in the phase encode direction, the magnetic resonance imaging scanner and the receive coils cooperating in order to effect sensitivity encoding in the phase encode direction.

6. The magnetic resonance imaging system as set forth in claim 4, wherein the sampling means also acquires magnetic resonance samples encoded in the phase encode direction, the magnetic resonance imaging scanner and the receive coils cooperating to effect variable density sensitivity encoding in the phase encode direction.

7. The magnetic resonance imaging system as set forth in claim 4, wherein:
    the magnetic resonance signals are encoded in the phase encode direction, and the sampling means acquires samples that are encoded in the phase encode direction and the readout direction with a sufficiently low sampling density that the intermediate reconstructed images are aliased in each of the phase encode direction and the readout direction; and
    the combining performed by the combining means unfolds the intermediate reconstructed images in both the phase encode direction and the readout direction to produce the final reconstructed image with the abasing removed.

8. The magnetic resonance imaging system as set forth in claim 1, wherein the sampling means performs the under-sampled receiving using a sampling time for each sample that is greater than a minimum sampling time for sampling at a maximum readout sampling rate.

9. The magnetic resonance imaging system as set forth in claim 1, wherein the means for combining unfolds the intermediate reconstructed images based on the coil sensitivity factors to remove the aliasing in the readout direction, the final field of view being increased over the measurement field of view.

10. A magnetic resonance imaging method including:
encoding magnetic resonance signals in at least a readout direction with a read magnetic field gradient profile;
sampling the magnetic resonance signals in the readout direction using a plurality of receive coils in order to acquire magnetic resonance samples from each coil in the central region of k-space in the readout direction while completely omitting sampling of high readout k-values in the readout direction;
reconstructing the magnetic resonance samples acquired from each coil into a corresponding intermediate reconstructed image, the reconstructed images having a measurement spatial resolution in the readout direction; and
combining the intermediate reconstructed images based on coil sensitivity factors in order to produce a final reconstructed image having a final spatial resolution in the readout direction that is increased over the measurement spatial resolution in the readout direction and wherein the sampling is performed over a shortened read magnetic field gradient profile such that the combining restores resolution in the readout direction.

11. A magnetic resonance imaging system including:
a magnetic resonance imaging scanner configured to encode magnetic resonance in at least a readout direction, the encoding including applying a read magnetic field gradient profile;
a sampler including a plurality of receive coils configured for receiving magnetic resonance signals and a sampling circuit configured for sampling the receive coils during application of the read magnetic field gradient profile in order to acquire samples from each receive coil, the sampling circuit acquiring samples in the readout direction that map to low frequency readout values of a k-space and not to higher frequency readout values of the k-space;
a reconstruction processor configured to reconstruct the magnetic resonance samples acquired from each coil into a corresponding intermediate reconstructed image the intermediate reconstructed images having a measurement spatial resolution in the readout direction; and
a means for combining the intermediate reconstructed images based on coil sensitivity factors in order to produce a final reconstructed image having a final spatial resolution in the readout direction that is increased over the measurement spatial resolution in the readout direction.

12. The magnetic resonance imaging system as set forth in claim 11, wherein the sampling circuit samples the low frequency readout values of the k-space over a shortened read gradient profile.

13. The magnetic resonance imaging system as set forth in claim 11, wherein:
the sampling circuit samples the receive coils at a sampling rate in the phase encode direction which is sufficiently low such that the reconstructing means produces the intermediate reconstructed images with aliasing in the phase encode direction; and
the combining performed by the combining means produces the final reconstructed image with the aliasing in the phase encode direction removed.

14. The magnetic resonance imaging system as set forth in claim 11, wherein the means for combining implements an inverting of a sensitivity matrix constructed from the coil sensitivity factors.

15. A magnetic resonance imaging method including:
encoding magnetic resonance signals in at least a readout direction with a read magnetic field gradient profile;
sampling the magnetic resonance signals in the readout direction using a plurality of receive coils in order to acquire magnetic resonance samples from each coil at a measurement sampling rate undersampled in the readout direction;
reconstructing the magnetic resonance samples acquired from each coil into a corresponding intermediate reconstructed image, the reconstructed images having a measurement field of view in the readout direction and having aliasing in the readout direction due to the undersampling in the readout direction; and
combining the intermediate reconstructed images based on coil sensitivity factors in order to produce a final reconstructed image having a final field of view in the readout direction that is increased over the measurement field of view in the readout direction, the combining restoring field of view in the readout direction and removing the aliasing in the readout direction.

16. The magnetic resonance imaging method as set forth in claim 15, wherein the encoding of magnetic resonance signals includes:
encoding the magnetic resonance signals using transmit SENSE.

17. The magnetic resonance imaging method as set forth in claim 15, wherein the combining based on the coils sensitivities produces a final reconstructed image having a higher spatial frequency content in the readout direction than any one of the intermediate reconstructed images.

18. The magnetic resonance imaging method as set forth in claim 17, wherein the high spatial frequency content of the final reconstructed image is generated during the combining by transforming aliasing in the readout direction of the intermediate reconstructed images into image data outside a field of view of the intermediate reconstructed images.

* * * * *